US006998914B2

(12) United States Patent
Robinson (10) Patent No.: US 6,998,914 B2
(45) Date of Patent: Feb. 14, 2006

(54) MULTIPLE POLAR AMPLIFIER ARCHITECTURE

(75) Inventor: Ian Robinson, Venice, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 19 days.

(21) Appl. No.: 10/719,513

(22) Filed: Nov. 21, 2003

(65) Prior Publication Data

US 2005/0110565 A1 May 26, 2005

(51) Int. Cl.
*H03F 3/68* (2006.01)
(52) U.S. Cl. .................................... 330/124 R; 330/10
(58) Field of Classification Search .............. 330/10, 330/124 R
See application file for complete search history.

(56) References Cited

U.S. PATENT DOCUMENTS

| 6,137,355 | A  | * | 10/2000 | Sevic et al. .................. 330/51 |
| 6,175,273 | B1 |   | 1/2001  | Sigmon et al. |
| 6,252,461 | B1 |   | 6/2001  | Raab |
| 6,255,906 | B1 | * | 7/2001  | Eidson et al. ........... 330/124 R |
| 6,486,733 | B1 |   | 11/2002 | Myers et al. |
| 6,552,634 | B1 |   | 4/2003  | Raab |
| 6,853,244 | B1 | * | 2/2005  | Robinson et al. ....... 330/124 R |
| 2002/0084844 | A1 | | 7/2002 | Monroe |
| 2002/0193085 | A1 | | 12/2002 | Mathe et al. |

FOREIGN PATENT DOCUMENTS

EP     0 549 101 A2    6/1993

OTHER PUBLICATIONS

F.H. Raab, et al., "High-Efficiency L-Band Kahn-Technique Transmitter", IEEE MTT-S Digest, 1998, p. 585-588.
D. Rudolph, "Kahn EER Technique With Single-Carrier Digital Modulations", IEEE Transactions on Microwave Theory and Techniques, vol. 51, No. 2, Feb. 2003, p. 548-552.
International Search Report for corresponding PCT/US2004/038776, completerd Mar. 10, 2005 by C. Lorenzo of the European Patent Office.
Leonard R. Kahn, "Single-Sideband Transmission by Envelope Elimination and Restoration", XP-000990633, Proceedings of the I.R.E., pp. 803-806.

* cited by examiner

*Primary Examiner*—Khanh V. Nguyen
(74) *Attorney, Agent, or Firm*—Tarolli, Sundheim, Covell & Tummino L.L.P.

(57) ABSTRACT

An amplifier system for amplifying an input signal comprises first and second polar amplifier assemblies and a mode selector. The first polar amplifier assembly is operative to amplify the input signal to produce an amplified output signal for the system when the system is in a first mode. The second polar amplifier assembly is operative to amplify the input signal to produce the amplified output signal for the system when the system is in a second mode. A mode selector selects a mode of operation from at least the first and second modes for the amplifier system according to at least one characteristic of the input signal relative to at least one threshold parameter.

28 Claims, 5 Drawing Sheets

MULTIPLE POLAR AMPLIFIER ARCHITECTURE

CROSS REFERENCE TO RELATED APPLICATIONS

The present application is related to U.S. patent application Ser. No. 10/719,514, filed Nov. 21, 2003 entitled "MODIFIED POLAR AMPLIFIER ARCHITECTURE", assigned to the same assignee as the present application.

TECHNICAL FIELD

The present invention relates generally to electronic devices, and more particularly to a multiple polar amplifier architecture.

BACKGROUND OF THE INVENTION

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent channels but produces time-varying envelopes. In addition to amplifying individual waveforms with time varying envelopes, many transmitters (especially in base stations) are being configured to amplify multiple carriers. Multi-carrier signals have high a wide distribution of power levels resulting in a large peak-to-average ratio (PAR). Therefore, the operation of linear amplifiers in these types of signals is very inefficient, since the amplifiers must have their supply voltage sized to handle the large peak voltages even though the signals are much smaller a substantial portion of the time. Additionally, the size and cost of the power amplifier is generally proportional to the required peak output power of the amplifier.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and application growing in use. Each requires amplification of a waveform with high PAR levels, above 10 dB in some cases. The sparse amount of spectrum allocated to terrestrial wireless communication requires that transmissions minimize out-of-band (OOB) emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver both for manufacturing and operation.

Non-linear classes (e.g., Class C, D, E and F type amplifiers) of RF power amplifiers switch the RF devices on and off in or near saturation, and are more efficient than linear classes of operation such as Class-A, Class-AB or Class-B type which conduct during at least half of the RF cycle and are significantly backed off from saturation, generally avoiding the region of operation where the gain is compressed. However, non-linear amplifiers can only be employed with constant envelope signals, such as frequency modulations (FM) and certain forms of phase modulation (PM), signals with modulated amplitudes cause severely distorted outputs from these classes of amplifiers.

One efficiency enhancement technique that has been employed is known as the Kahn or Envelope Elimination and Restoration (EER) technique. The EER technique detects the envelope of the incoming signal to produce a baseband amplitude modulated (AM) signal. The EER technique limits the input signal to produce a phase modulated (PM) component with a constant envelope, the incoming signal being proportional to the product of the AM and PM signals. The PM signal is provided to the input of the power amplifier along a PM path and the amplitude modulated component is employed to modulate the supply of the power amplifier along an AM path. Amplitude modulation of the supply terminal of the final RF power amplifier restores the envelope to the phase-modulated carrier, creating an amplified version of the input signal. Since the signal input into the power amplifier has a constant envelope amplitude, a more efficient class of power amplifier (e.g., Class-C type amplifiers) can be employed to amplify the input signal. Additionally, since the supply signal is amplitude modulated, the amplifier is operating at saturation enhancing the efficiency of the amplifier.

Amplifiers that employ the EER technique are referred to as polar amplifiers. Polar amplifiers have demonstrated very high efficiency but can distort signals and cause significant amounts of OOB emissions. Most available linearization techniques are not applicable to polar amplifiers because of their dual signal nature, making it difficult to reduce OOB emissions. Traditional implementations require the two signal paths (AM and PM) to be extremely well synchronized. The two paths may each require substantially wider bandwidth components than the original signal. If the signal crosses through a zero-amplitude point, referred to as a zero crossing, it may cause the polar amplifier to cut-off and/or require an extremely rapid and difficult phase change in the constant envelope phase modulated path. If the signal varies over a large dynamic range it may cause the polar amplifier to operate with very low supply (e.g., drain) voltages resulting in additional signal distortion and can cause the amplifier to shutoff when the supply voltage becomes too low. As a result, the polar amplifier has only been employed with a limited range of waveforms. In traditional EER systems, OOB emissions have been controlled by calibrating the delay along the two paths to synchronize the reconstitution of the signal and by detecting the envelope of the output and supplying feedback to the path amplifying the envelope (the AM path).

SUMMARY OF THE INVENTION

The present invention relates to an amplifier system that switches modes of operation based on a characteristic of an input signal relative to a threshold level (e.g., envelope amplitude level, digital count representation of signal level, power amplifier power level, or the like). In accordance with one aspect of the invention, an amplifier system is provided comprising first and second polar amplifier assemblies and a mode selector. The first polar amplifier assembly is operative to amplify the input signal to produce an amplified output signal for the system when the system is in a first mode. The second polar amplifier assembly is operative to amplify the input signal to produce the amplified output signal for the system when the system is in a second mode.

A mode selector selects a mode of operation from at least the first and second modes for the amplifier system according to at least one characteristic of the input signal relative to at least one threshold parameter. The amplifier system can utilize N polar amplifier assemblies based on additional threshold parameters, where N is an integer greater than 2, such that one of the N polar amplifier assemblies is selected at a time based on at least one characteristic of the input signal relative to a plurality of threshold parameters.

In accordance with another aspect of the invention, an amplifier system is provided for amplifying an input signal to provide an amplified output signal. A plurality of power amplifiers are each operative to amplify an input signal to provide an amplified output signal. Respective input paths are coupled to respective input terminals of the power amplifiers. Respective supply paths are coupled to respective supply terminals of the power amplifiers. A mode selector selects one of the plurality of power amplifiers to operate as a polar amplifier based on a characteristic of the input signal relative to at least one threshold parameter.

In accordance with yet another aspect of the present invention, a method is provided for amplifying an input signal. One of a plurality of modes of operation for an amplifier system is selected. The plurality of modes include at least a first mode of operation associated with a first power amplifier and a second mode of operation associated with a second power amplifier. The selection is based on a characteristic of an input signal relative to at least one threshold parameter. A phase modulated component of the input signal is transmitted to an input terminal of the first power amplifier, and an amplitude modulated component of the input signal is transmitted to a supply terminal of the first power amplifier during the first mode of operation. The phase modulated component of the input signal is transmitted to an input terminal of the second power amplifier, and the amplitude modulated component of the input signal is transmitted to a supply terminal of the second power amplifier during the second mode of operation. The input signal is amplified via the first power amplifier in the first mode of operation and via the second power amplifier in the second mode of operation. The system continuously switches between the plurality of modes of operation as the input signal changes to provide an amplified output signal.

DETAILED DESCRIPTION OF INVENTION

The present invention relates to an amplifier system that switches modes of operation based on a characteristic of an input signal relative to a threshold level (e.g., envelope amplitude level, digital count representation of signal level, power amplifier power level). In one aspect of the present invention, an amplifier system is provided that includes a plurality of polar amplifiers. The amplifier system selects an associated mode of operation in which the input signal is provided to one of the plurality of polar amplifiers. A mode selector (e.g., a digital component) determines the mode in which the system operates based on characteristics of the input signal.

The polar amplifiers can have different properties that make one of the modes desirable for given signal characteristics. For example, when the amplitude of the signal to be amplified approaches and/or reaches zero level polar amplifiers cut-off and/or require an extremely rapid and difficult phase change in the constant envelope phase modulated. The low amplitude level results in the supply voltage of the polar amplifier dropping below a threshold level, where the amplifier either distorts the amplified signal significantly or cuts-off. This threshold voltage is different for different amplifier designs (e.g. bipolar, FET, etc) and can vary widely for different semiconductor types. For example, a high range amplifier can have a high maximum supply but introduce significant distortion at supply voltages associated with an input signal envelope amplitude some distance from zero amplitude. A lower range amplifier can have a lower maximum supply, and accordingly a lower maximum output level, but be capable of low-distortion operation for supply voltages corresponding to envelope amplitudes closer to zero.

The present invention overcomes one or more known obstacles in polar amplifier designs including synchronization of the two signal paths, large bandwidth requirements on each path, signal distortion due to large dynamic range of the input signal, signal distortion due to zero-crossings, which drive the amplifier supply voltage below a critical level, and signal distortion and OOB emissions related to operating a saturated amplifier. Employing additional polar amplifiers when the signal envelope is at its lower levels reduces the bandwidth required for both AM and PM paths within the amplifier assemblies. Reducing the bandwidth of the AM path is particularly important as the efficiency for providing the supply signal can be inversely proportional to bandwidth while the efficiency of the entire amplifier system is proportional to the efficiency of the AM path. The use of multiple polar amplifiers allows amplification over a large range of signal amplitudes characteristic of materials requiring a high supply voltage, while retaining the reduced zero-crossing sensitivity of lower voltage materials. The use of one or more delta-sigma DACs reduces the number of components in each path, simplifying synchronization.

In an exemplary embodiment, the present invention can employ a digital cross-cancellation technique that supplies one or more separate reference signals to be combined with the output of the main amplifier prior to transmission. The separate reference signals enable reduced peak signal levels, correct distortion from the main amplifier signal chain, and cancel significant portions of OOB emissions when a polar amplifier assembly is operating. Cancellation of OOB emissions can be accomplished by predicting and/or supplying the appropriate signals to the separate path, or by generating an undistorted or "clean" version of the wanted signal from which the cancellation or unwanted signals are electronically derived. Signal distortion and OOB emissions result from a number of sources including non-linearity in amplifiers, DACs, as well as from limiting or clipping of signals. When considering systems that split wanted signals into two or more components, such as polar amplifiers, additional errors can result from imperfect synchronization of signals amplified along separate paths and/or due to limitations in the bandwidth of a path. An "anti-distortion" signal can be created and combined with the signal chain prior to transmission. The difference in these two signals can be phase inverted, amplified, and combined with a delayed version of the final amplifier output signal to mitigate signal distortion and OOB emissions.

The digital cross cancellation technique generates a reference signal corresponding to the wanted signal. An inverted version of the reference signal can be compared to the final amplifier output. The difference in this comparison is used to generate a cancellation signal that may be inverted, amplified, and combined with a delayed version of the final amplifier. The cancellation signal also contains, optionally, digitally computed post-correction terms and signal cancellation components to remove any signals purposefully added to the wanted signals that the system should not broadcast. Added signals could include signals to cancel peak reduction signals or calibration signals that have been introduced into the main signal path. The present invention combines techniques to reduce out-of band emissions (OOB) and wanted signal distortion due to amplifier non-linearity and reduces wanted signal peak-to-average ratio (PAR) enabling the use of smaller, lower cost amplifiers and higher efficiency architectures. The hardware used for the digital cross cancellation technique can also be utilized to provide for signal restoration at very low signal levels (at or near zero crossings of the input signal), which cause even a low supply range power amplifier to cut-off and/or have enhanced distortion.

Figure 1:
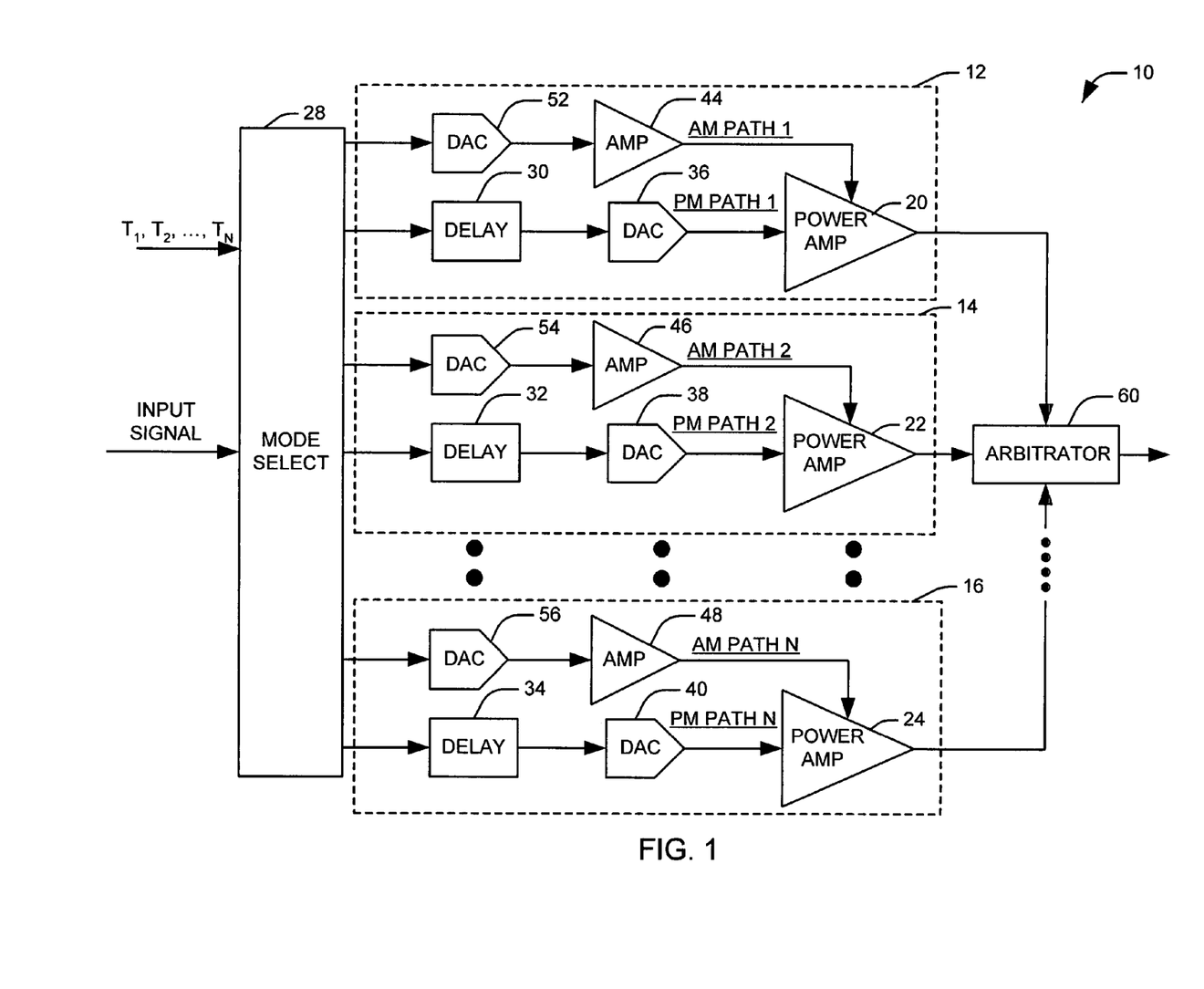
FIG. 1 illustrates a schematic block diagram of an amplifier system in accordance with an aspect of the present invention.

FIG. 1 illustrates a multiple polar amplifier system 10 in accordance with an aspect of the present invention. The amplifier system 10 includes a plurality of polar amplifier assemblies 12, 14, and 16, with the polar amplifier assemblies containing respective associated power amplifiers 20, 22, and 24 and appropriate circuitry for operating in respective associated polar amplification modes. The power amplifier assemblies (e.g., 14) can have varying properties, such as different ranges of operating voltages and different associated efficiencies. The amplifier system 10 continuously evaluates characteristics of an input signal relative to one or more parameters ($T_1$-$T_N$) representing values of one or more input signal characteristics (e.g., envelope amplitude level, digital count representation of signal level, power amplifier power level). For example, a given parameter can represent a selected envelope amplitude level or digital count corresponding to the envelope amplitude level. A mode of operation can then be selected according to the evaluation of the input signal characteristics. The mode of operation selects between which if any of the plurality of polar amplifier assemblies 12, 14, and 16 receives the input signal.

It is to be appreciated that the threshold parameters of the amplifier system 10 can be selected to enhance one or more characteristics associated with a desired output signal such as efficiency, linearity, distortion and acceptable OOB emissions of the amplifier system 10. The optimal threshold parameters can be related to one or more characteristics associated with the fabrication technology of one or more of the amplifier assemblies (e.g., Gallium Arsenide (GaAs), Indium Phosphide (InP), Gallium Nitride (GaN), Silicon (Si), Laterally Diffused Metal Oxide Semiconductors (LD-MOS)). Many exemplary embodiments of the present invention will be described with respect to the threshold parameters representing selected envelope amplitude levels for illustrative purposes. However, other characteristics associated with the input signal, the power amplifier and/or the fabrication technology can be employed to control the switching of the amplifier system among the modes associated with the plurality of amplifier assemblies.

The amplifier system 10 includes a mode selector 28 that can be comprise one or more digital components, such as an application specific integrated circuit (ASIC), field programmable gate array (FPGA), a digital signal processor (DSP) or a combination of digital hardware and/or software components. The mode selector 28 selects a mode of operation from one of a plurality of modes, which can include the associated modes of the plurality of polar amplifier assemblies 12, 14, and 16, as well as one or more other modes not associated with the polar amplifier assemblies. The mode selector 28 selects an appropriate mode based on one or more characteristics of the input signal relative to the one or more threshold parameters. The composite signal is typically a phase and/or amplitude modulated signal which can be represented by the product of two polar components, shown by the following equation:

$$A(t)\cos(\omega_C(t)+\phi(t)) \qquad \text{Eq. 1}$$

where A(t) is the amplitude modulated component and COS ($\omega_C(t)+\phi(t)$) is the phase modulated component, $\phi(t)$ is the phase component and $\omega_C(t)$ is the carrier frequency.

Where the system is operating in one of the polar modes, the mode selector 28 selects a polar amplifier assembly (e.g., 12) associated with the selected mode. The amplitude modulated component A(t) is provided to a supply terminal of the selected power amplifier (e.g., 20) along a amplitude modulated (AM) path, while the phase modulated component, possibly multiplied by a scalar, is provided to an input terminal of the selected power amplifier (e.g., 20) along a phase modulated (PM) path. The input signal can be in a variety of different amplitude and/or phase modulated forms. It is to be appreciated that Eq. 1 illustrates a polar representation of a single carrier input signal, where the actual signal can be a multi-carrier signal, which has analogous amplitude modulated and phase modulated components. The "carrier frequency" might be an average or weighted average of the multiple frequencies. For example, the signal can be a signal that conforms to WCDMA, multi-carrier GSM, OFDM or other signals having similar noise like signatures with high peak-to-average (PAR) ratios.

The power amplifiers 20, 22, and 24 include respective input terminals and supply terminals. The mode selector 28 has a first set of respective outputs coupled to respective delay elements 30, 32, and 34 within each polar amplifier assembly 12, 14, and 16. The delays 30, 32, and 34 allow the phase modulated (PM) paths of the assemblies 12, 14, and 16 to be synchronized with the amplitude modulated (AM) paths. The delays 30, 32, and 34 are coupled to the input terminals of their respective power amplifiers 20, 22, and 24 through respective digital-to-analog converters 36, 38, and 40.

The mode selector 28 has a second set of respective outputs coupled to modulation amplifiers 44, 46, and 48 through respective DACs 52, 54, and 56. The output of the modulation amplifiers 44, 46, and 48 are coupled to the supply terminals of their respective power amplifiers 20, 22, 24. The modulation amplifiers 44, 46, and 48 are typically efficient Class-S type or Class-G type modulators. The modulation amplifiers 44, 46, and 48 should be relatively efficient since the overall efficiency of each path (e.g., 12) is proportional to efficiency of its associated modulation amplifier (e.g., 44). It is to be appreciated that a given modulation amplifier (e.g., 44) can be a pulse width modulator, a switching amplifier or a linear amplifier based on desirable bandwidth and acceptable distortion limits. Low distortion is required, because in polar amplification, the AM path carries an information-bearing signal; errors in the AM signal result in errors in the output.

The power amplifiers 20, 22, and 24 are typically high efficiency amplifiers (e.g., Class C, or class D, E, F switching type amplifiers) where the amplifiers are either switching between two levels or otherwise not conducting for an appreciable fraction of the conduction cycle. However, other less efficient amplifier types, such as linear amplifiers (e.g., Class-A, Class-AB, Class-B) can be employed. It is also to be appreciated that the power amplifiers 20, 22, and 24 can be other classes of amplifiers based on desirable bandwidth and acceptable distortion limits. The present invention is completely functional with the amplifiers operating in one or more classes in the plurality of modes.

When a polar mode is selected, the mode selector 28 transmits, through the associated delay element (e.g., 30), the phase modulated component COS ($\omega_C(t)+\phi(t)$) of the composite signal in digital form to the PM path DAC (e.g., 36) in the selected polar amplifier assembly (e.g., 12). The phase modulated component has a substantially constant signal envelope. The PM path DAC (e.g., 36) converts the phase modulated component into the analog domain, which is provided to the input terminal of the selected power amplifier (e.g., 20). The mode selector 28 concurrently transmits the amplitude modulated component A(t) of the composite input signal in digital form to the AM path DAC (e.g., 52) associated with the selected polar amplifier assembly (e.g., 12). The AM path DAC (e.g., 52) converts the amplitude modulated component A(t) from the digital domain to the analog domain. The analog amplitude modulated component is then provided to the associated modulation amplifier (e.g., 44), which amplitude modulates the supply terminal of the selected power amplifier (e.g., 20). It will be appreciated that the selected amplifier path can change as characteristics of the input signal change.

In one aspect of the invention, one or more of the AM path DACs 52, 54, and 56 and the PM path DACs 36, 38, and 40 are delta-sigma modulated DACs. Delta-sigma modulation is a technique used to generate a coarse estimate of a signal using a small number of quantization levels and a very high sampling rate. The small number (two for a one-bit quantizer) of discrete levels introduces significant "quantization" noise into the system. The effect of oversampling and the use of an integrator feedback-loop in delta-sigma modulation are effective in shifting noise to out-of-band frequencies. The noise shifting properties and introduction of quantization error enables efficient use of subsequent filtering stages to remove noise and produce a more precise representation of the input at a much higher frequency. The delta-sigma DACs can be employed to convert the input signal directly to radio transmission frequencies, such that further frequency conversion of the signals via conventional analog mixers is not required. The radio transmission frequencies can be in radio frequency (RF) ranges (e.g., megahertz range) or in microwave frequency ranges (e.g., gigahertz range).

The modulation of the supply voltage of the selected power amplifier (e.g., 20) provides a reconstructed amplified version of the composite input signal. The non-selected power amplifiers (e.g., 22 and 24) are either provided with a constant and minimal supply voltage to minimize their electrical consumption or are switched off. If left on they are provided either zero or very low level input signals. Accordingly, the output of the non-selected power amplifiers (e.g., 22 and 24) is negligible. The outputs of all three power amplifiers 20, 22, and 24 are provided to an output arbitrator 60. The output arbitrator 60 selects between or combines the outputs of the power amplifiers 20, 22, and 24 to produce a unified output signal. For example, the output arbitrator 60 can comprise an adder that sums the outputs of the three power amplifiers 20, 22, and 24 to produce the unified signal. Since the non-selected power amplifiers (e.g., 22 and 24) produce negligible outputs, the unified output signal would represent an amplified version of the input signal. Alternatively, the output arbitrator 60 can comprise one or more switches that are driven by the mode selector 28 to provide the appropriate signal.

Figure 2:
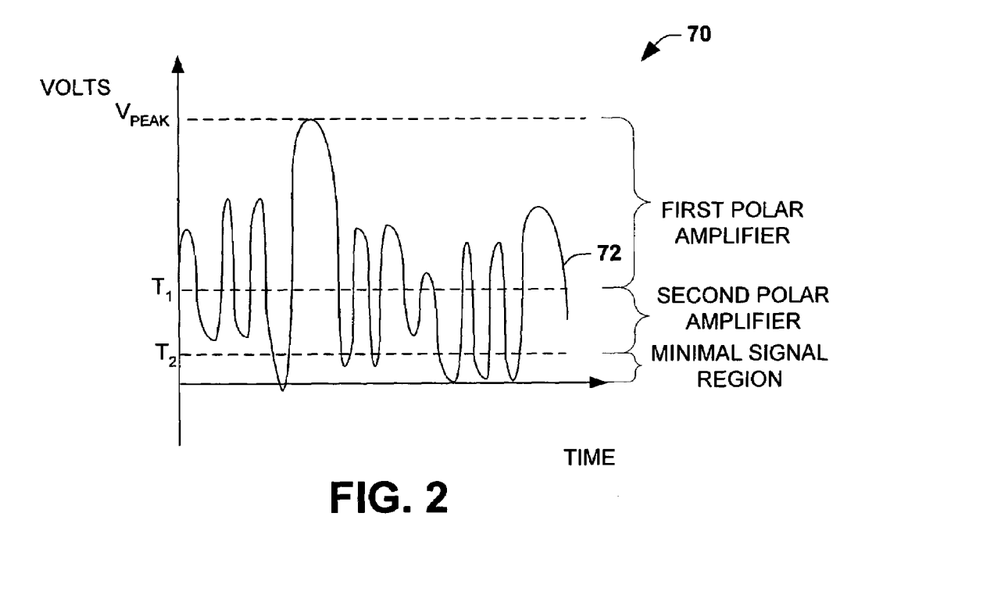
FIG. 2 illustrates a graph of voltage versus time of an exemplary input signal.

FIG. 2 illustrates a graph 70 of voltage versus time of an exemplary composite input signal 72. The graph 70 illustrates the operation of a multiple polar amplifier system having two polar amplifier assemblies. The system provides the input signal to a first polar amplifier assembly when the input signal envelope has an amplitude greater than an envelope amplitude threshold parameter $T_1$. The input signal is provided to a second power amplifier assembly when the input signal envelope amplitude falls between the first envelope amplitude threshold parameter, $T_1$, and a second envelope amplitude threshold parameter, $T_2$. Signals falling below the second envelope amplitude threshold parameter, $T_2$, fall within a distortion range of the second polar amplifier. Generally, this signal range is small enough to be disregarded. The present invention can either input the low level signal into the second polar amplifier and accept the distortion for this very small portion of the signal range, or it can input zero signal level into the second amplifier when signals are below $T_2$. In an exemplary embodiment, a digital cross correction (DCC) path can be employed to correct signal distortion and OOB emissions for signals falling below the second envelope amplitude threshold parameter, $T_2$.

When the first polar amplifier is operating, the second polar amplifier can be fixed at a constant supply level with zero or very low level input or the second amplifier can be turned "OFF". Similarly, the first amplifier can be shut off or provided a constant supply with zero or very low level input signal when the second amplifier is in operation. When the signal falls below $T_2$, into a minimal signal range, both polar amplifiers can be deactivated or the system can continue to operate in the second mode. The output can be provided as the original input signal in analog form, no signal, or a signal provided by a digital cross cancellation assembly.

The envelope amplitude threshold parameters, $T_1$ and $T_2$, can be selected according to the properties of the polar amplifiers. For example, a first polar amplifier assembly fabricated using Gallium Nitride (GaN) or Laterally Diffused Metal Oxide Semiconductors (LDMOS) can be operated over the range from about three volts to about twenty-five volts. A second polar amplifier assembly fabricated using Gallium Arsenide (GaAs), Indium Phosphide (InP), or Complementary Mextal Oxide Semiconductors (CMOS) can have a low-distortion operating range from about one volt to about five volts. Accordingly, the first envelope amplitude threshold parameter, $T_1$, can be set between at about three volts and the second envelope amplitude threshold parameter, $T_2$, can be set at about one volt to maximize the time the signal is amplified by the first polar amplifier.

Alternatively, $T_1$ can be set to about 5 volts, minimizing the range of signals that are amplified by the first polar amplifier and the bandwidth required for its AM path.

Figure 3:
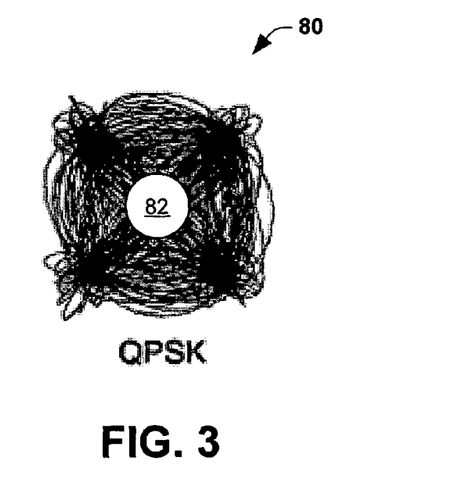
FIG. 3 illustrates a vector diagram of a quadrature phase-shift keying (QPSK) digital modulation scheme for the output of a polar amplifier.

FIG. 3 illustrates a vector diagram 80 of a quadrature phase-shift keying (QPSK) digital modulation scheme for a polar amplifier output having a single polar amplifier avoiding distortion and cut-off by amplifying signals above $T_1$ only. The diagram shows the signal components in a polar coordinate system where the "X" represents the phase locations of the QPSK symbols and the other traces are transitions between symbols. Different amplitude levels of the signal fill in the "X". Vector diagram 80, shows the ensemble of output signals from operation of the single polar amplifier system. A vector hole 82 shows the absence of all signals whose amplitude is below the selected threshold. As a result, information associated with the vector hole 82 of the amplified signal becomes lost, potentially resulting in bit errors at the receiver, and there is increasing OOB emission levels as the radius of the hole is increased.

Figure 4:
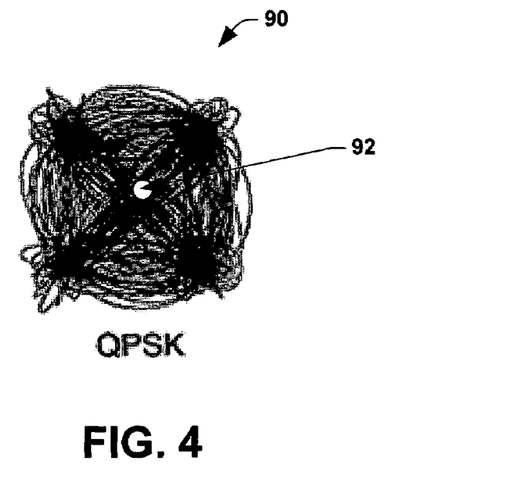
FIG. 4 illustrates a vector diagram of a quadrature phase-shift keying (QPSK) digital modulation scheme for the output of a multiple polar amplifier system.

FIG. 4 illustrates a vector diagram 90 of a quadrature phase-shift keying (QPSK) digital modulation scheme for a multiple polar amplifier architecture. As illustrated in the vector diagram 90, the vector hole associated with operation of a polar amplifier at low amplitude or near zero crossings is reduced to a much smaller hole 92. This reflects the ability of the multiple polar amplifier system to shift signals within an undesirable range for a first polar amplifier to a second polar amplifier that is designed for operation within that range. As a result, the zero-crossing distortion and associated out-of-band (OOB) emissions experienced by the amplifier are reduced. The small amount of distortion remaining can be ignored or corrected via a digital cross-cancellation technique for improved performance.

Figure 5:
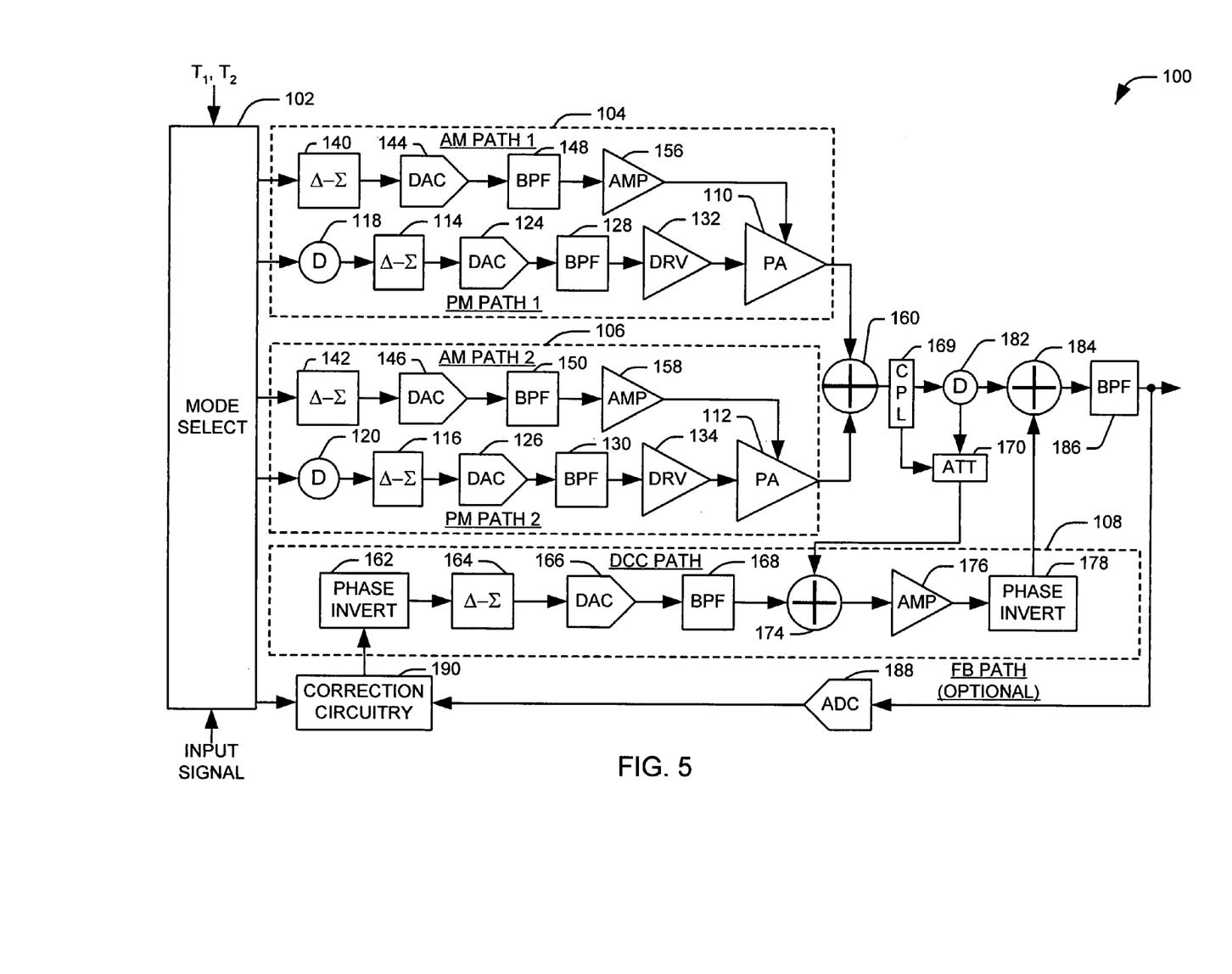
FIG. 5 illustrates a schematic block diagram of an exemplary multiple polar amplifier system in accordance with an aspect of the present invention.

FIG. 5 illustrates an exemplary multiple polar amplifier system 100 that incorporates a restoration mode in accordance with an aspect of the present invention. The multiple polar amplifier system 100 includes a mode selector 102 that selects between operating in a first polar mode, a second polar mode, or a restoration mode. A first polar mode, corresponding to a first polar amplifier assembly 104 is selected when the amplitude of the input signal envelope exceeds a first threshold parameter, $T_1$. A second polar mode, corresponding to a second polar amplifier assembly 106, is selected when the amplitude of the input signal envelope falls between the first threshold parameter, $T_1$, and a second threshold parameter, $T_2$. The mode selector 102 selects a restoration mode, corresponding to a digital cross-cancellation path, 108, where the amplitude of the input signal envelope falls below the second threshold parameter $T_2$.

The path selector 102 includes a plar convertor operative to transform the input signal into a polar representation of the input signal when the system is operating in one of the two polar modes. The composite input signal is typically a phase and/or amplitude modulated signal that can be represented in polar form as illustrated in Eq. 1. While two polar amplifier assemblies 104 and 106 are shown in the illustrated system, it will be appreciated that more than two polar amplifier assemblies can be utilized in accordance with the present invention, each representing an associated polar mode of the system 100. Where additional assemblies are used, additional parameters can be provided to the mode selector 102.

It will be appreciated that in a polar amplifier arrangement, the supply voltage provided to the amplifier varies with the amplitude of the input signal envelope. Accordingly, the values of the threshold parameters can correspond to characteristic minimum supply voltages of the power amplifiers 110 and 112 within the polar amplifier paths 104 and 106. A given power amplifier may operate without significant distortion at high voltages, but introduces distortion at lower supply voltages. For example, an amplifier fabricated using GaN or LDMOS may operate without significant distortion for supply voltages up to twenty-five volts, but experience distortion if the supply falls below three volts. A second power amplifier fabricated using GaAs, InP, or CMOS may operate without significant distortion for supply voltages ranging from one volt to five volts. Threshold parameters can be selected to correspond to these ranges, such that the input signal will be provided to the first amplifier when a comparatively high supply voltage is required to amplify the signal, and to the second amplifier when a comparatively low supply voltage is required.

When the system is operating in one of the polar modes, the appropriated polar amplifier assembly (e.g., 104) is selected. The mode selector 102 generates a phase modulated (PM) digital input signal along a PM path to an input of the power amplifier (e.g., 110) associated with the selected path (e.g., 104), and an amplitude modulated (AM) supply signal along an AM path to a supply terminal of the selected power amplifier (e.g., 110). The input signal is a constant envelope phase modulated component of the composite input signal, while the supply signal is an amplitude modulated component of the input composite signal. An unselected power amplifier (e.g., 112) is provided with respective maintenance inputs at their input terminals. A given maintenance input signal can be a constant signal, no signal, or a constant envelope phase modulated component of the composite signal or the composite signal. A maintenance supply signal can be provided to the unselected power amplifier (e.g., 112) as a fixed amplitude signal level that provides a fixed supply level to the unselected power amplifiers. Alternatively, either the input or the supply level of the unselected power amplifier (e.g., 112) can be set to zero or ground essentially turning the power amplifiers "OFF".

The path selector 102 can add or remove signals to the signals before they are converted to AM and PM paths to improve the performance of the amplifier system 100. For example, the mode selector 102 can remove peaks associated with the input signal and/or the amplitude modulated component of the input signal, for example, by clipping and/or adding anti-peak signals to the signals. Additionally, the mode selector 102 can perform pre-distortion of the input signal and/or the phase and amplitude modulated components of the composite input signal. Alternatively, pre-distoration can be performed prior to peak removal or other distortion mitigating techniques. The mode selector 102 also generates a digital reference signal associated with the desired output on the digital cross-cancellation path prior to any modification of the first digital output signal and the second digital output signal. It is to be appreciated that this "clean" reference signal can be a representation of the desired output signal or an inverted representation of the desired output signal.

The polar amplifier assemblies comprise respective AM and PM paths for operation in a polar mode. The PM paths of the assemblies 104 and 106 comprise respective delta-sigma modulators 114 and 116 operatively connected to the mode selector 102 through respective delay components 118 and 120. The delay components 118 and 120 facilitate synchronization of the PM paths and the AM paths of their respective assemblies and also facilitate cross-cancellation of the final output signal. The delta-sigma modulators 114 and 116 are coupled to respective digital-to-analog converters (DACs) 124 and 126. In an exemplary implementation, the DACs 124 and 126 are one bit DACs, but multi-bit DACs can also be utilized. The outputs of the DACs 124 and 126 are provided to respective band pass filters 128 and 130. For each assembly (e.g., 104), the delta-sigma modulator (e.g., 114), DAC (e.g., 124), and band pass filter (e.g., 128) cooperate to perform a digital-to-analog conversion of a phase modulated input signal directly to radio transmission frequencies.

The band pass filters 128 and 130 are operatively connected to respective drivers 132 and 134, each of which operates to provide additional gain to an analog input signal. The drivers 132 and 134 are operatively connected to the input terminal of their respective power amplifiers 110 and 112 to provide a phase modulated analog input signal when their respective polar amplifier assemblies 104 and 106 are active. The power amplifier 114 can be a high efficiency amplifier (e.g., Class C, or class D, E, F type switching type amplifiers). However, other less efficient amplifier types, such as linear amplifiers (e.g., Class-A, Class-AB, Class-B) can be employed based on desired performance, acceptable efficiency and acceptable OOB emissions.

The AM paths of the assemblies comprise respective delta-sigma modulators 140 and 142 operatively connected to the mode selector 102. The delta-sigma modulators 140 and 142 are coupled to respective DACs 144 and 146 (e.g., 1-bit DAC, multi-bit DAC) and band pass filters 148 and 150. For each assembly (e.g., 104), the delta-sigma modulator (e.g., 140), DAC (e.g., 144), and band pass filter (e.g., 148) can cooperate to perform a digital-to-analog conversion of an amplitude modulated supply signal directly to radio transmission frequencies. The output of the band pass filters 148 and 150 is provided to respective modulation amplifiers 156 and 158 (e.g., Class-S, Class-G). The outputs of the modulation amplifiers 156 and 158 are coupled to supply terminals of their respective power amplifiers 110 and 112 to provide a desired amplitude modulation when their respective assembly 104 and 106 is active and a fixed supply level when the assembly is not active. The outputs of the power amplifiers 110 and 112 are summed at a first summer or coupler 160 to provide a combined output signal.

The mode selector 102 provides a clean reference signal along the digital cross-cancellation path 108 to a digital phase inverter 162. The reference signal corresponds to a desired amplified output signal, and is provided from the input signal prior to any modifications or splitting of the signal into AM and PM components. Alternatively, the digital inverter 162 can be eliminated and the inverted version of the clean reference signal can be provided by the mode selector 102. The inverted clean reference signal is transmitted to a delta-sigma modulator 164. The delta-sigma modulator 164 is coupled to a DAC 166 (e.g., 1-bit DAC, multi-bit DAC) and a band pass filter 168. The delta-sigma modulator 164, the DAC 166 and the band pass filter 168 cooperate to perform a digital-to-analog conversion directly to radio transmission frequencies of the inverted reference signal.

A small portion of the first summer 160 output is split off via a coupler 169 to an attenuator 170. The output of the attenuator 170 is summed with the inverted clean reference signal through a second summer or coupler 174. The output of the summer 174 is primarily signal distortion and out-of-band (OOB) emissions. The output of the summer 174 is amplified by a cancellation amplifier 176 to produce a cancellation signal (ϵ). The cancellation signal is phase inverted through an inverter 178 to provide an inverted cancellation signal. It will be appreciated that the form of the reference signal will vary with the class of cancellation amplifier 176 employed. If cancellation amplifier 176 is a linear amplifier, the reference signal is the normal composite signal.

The inverted cancellation signal is recombined with a delayed version of the output of the first summer 160 provided through a delay component 182 via a third summer or coupler 184 to remove OOB emissions and reduce distortion levels. The output of the third summer 184 is then provided to an optional band pass filter 186 that filters out any remaining unwanted signals outside the desired transmission band. It is to be appreciated that the dynamic range of DAC 166 and the size of the cancellation amplifier 176 will be much smaller than similar components in the PM path. The size of amplifier 176 will be determined by either the magnitude of OOB correction needed when providing digital cross-cancellation or by the magnitude of signal restoration required.

When the system is in one of the polar modes, the digital cross-cancellation technique in accordance with an aspect of the present invention can supply correction for amplifier distortions and OOB emissions resulting from imperfect synchronization of the AM and PM paths, finite bandwidth effects in either path, and it can correct spectral splatter (e.g., spectral regrowth or OOB emissions) that occurs from intentional clipping of the wanted signals performed to allow for amplifier size reduction (e.g., amplifiers in the AM and PM paths are sized to according to the peak signals). Additionally, since a separate digital reference signal is supplied, which does not include modifications of the wanted signal such as clipping, the final output signal can be corrected without the need for additional correction information during the amplification process.

When the restoration mode is selected (e.g., when the signal envelope amplitude drops below the second threshold parameter, $T_2$), the digital cross-cancellation technique can be employed to provide a desired output signal, as the system is operating at substantially low amplitude levels in the distortion region of the second power amplifier 112. The correction path provides most or all of the desired signal during the restoration mode, and the power amplifiers 110 and 112 remain idle, such that their outputs are zero or relatively insignificant. While idle, the supply level of the power amplifiers 110 and 112 can be set at a minimum and constant level to ensure limited power consumption, while the input signal into the power amplifiers 110 and 112 can be set to zero or some other low power level signal, such that the correction path provides a substantial or all of the desired output signal, thus filling in the hole 92 illustrated in FIG. 3.

Optionally, a feedback loop through a feedback (FB) path can be provided to sample the output of the bandpass filter 186 of the combined signals, down convert (if needed), and digitize (e.g., with a wideband ADC 188) to examine the entire output transmission band. The feedback signal can be provided to correction circuitry 190 coupled to the phase inverter 162 to correct for errors and signal distortion associated with the correction path.

Figure 6:
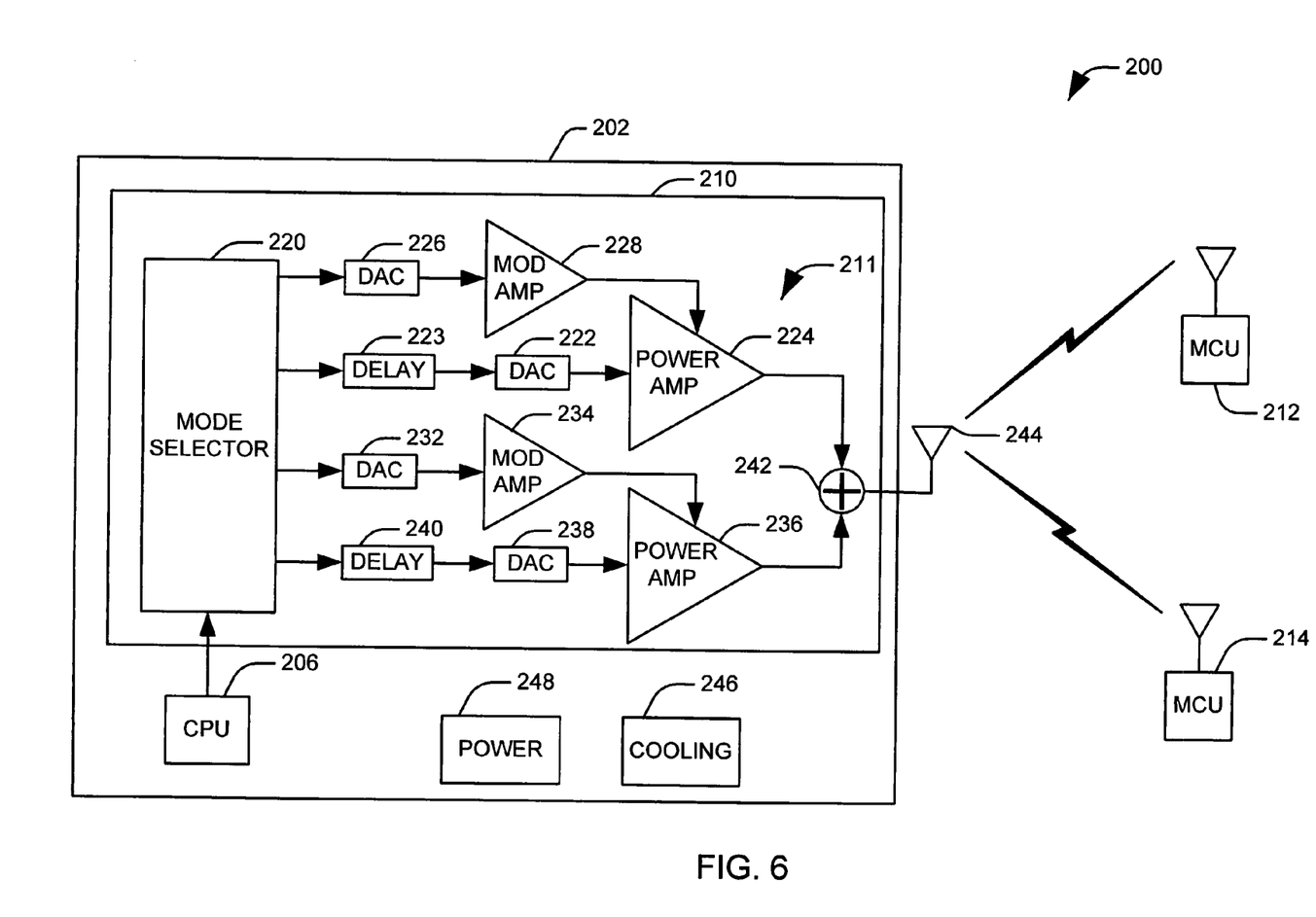
FIG. 6 illustrates a block diagram of a communication system in accordance with an aspect of the present invention.

The amplification system of the present invention can be employed in a number of applications. The amplification system can be employed in wireless transmitter applications for base stations (e.g., satellites, cellular), handsets, and other mobile communication devices. FIG. 6 illustrates a communication system 200 having a base station 202 with a transmitter 210 employing an exemplary multiple polar amplifier system 211 in accordance with an aspect of the present invention. The illustrated amplifier system 211 has two associated polar amplifier assemblies, but it will be appreciated that a multiple polar amplifier system can be utilized having more than two polar assemblies. The base station 202 employs a central processing unit (CPU) to operate the base station 202 and provide an input signal to the amplifier system 211. For example, the CPU 206 can generate the type of signal (e.g., WCDMA, GSM, OFDM) to be transmitted. The base station 202 communicates to a group of mobile communication unit (MCUs) comprised of MCUs 214 and 216. The MCUs 214 and 216 are for illustrative purposes and it should be appreciated that the group of MCUs can include a greater number of MCUs based on the number of carriers in the output signal.

The amplifier system 211 includes a mode selector 220 that selects an appropriate operating mode for the system according to characteristics of the input signal. In the illustrated embodiment, at least two modes correspond to the operations of the polar amplifier assemblies. A third mode of operation can also be utilized, for example, allowing the input signal to remain in its original state or restoring the signal via digital cross-cancellation. For the purpose of example, a mode corresponding to the uppermost polar amplifier assembly will be treated as a selected mode. It will be appreciated, however, that either of the assemblies, or even neither of the assemblies can be selected at various times during the operation of the system, and that the selected assembly can change relatively rapidly during operation.

The mode selector 220 transmits a phase modulated component of the input signal in digital form to a first DAC 222 on the selected path through a delay 223. The first DAC 222 converts the phase modulated component into the analog domain and provides the analog phase modulated component to the input terminal of the selected power amplifier 224. The mode selector 220 concurrently transmits an amplitude modulated component A(t) of the composite signal in digital form to a second DAC 226 associated with the selected polar amplifier assembly. The second DAC 226 converts the amplitude modulated component A(t) from the digital domain to the analog domain. The analog amplitude modulated component is then provided to a modulation amplifier 228 associated with the selected polar amplifier assembly, which amplitude modulates the supply terminal of the selected power amplifier 224. The output of the selected power amplifier 224 is a reconstructed amplified version of the composite signal.

Any non-selected amplifier assemblies remain inactive. The non-selected assembly comprises a third DAC 232 that receives either a low, constant supply signal from the mode selector 220 or no signal at all. If a signal is received, it is provided to a second modulation amplifier 234 that provides a constant gain to the signal and provides it to the non-selected power amplifier 236 as a supply voltage. A fourth DAC 238 is operatively connected to the path selector 220 through a delay 240. One of a phase-modulated component of the input signal, no signal, or a constant signal can be provided to the fourth DAC 238 for conversion to an analog signal. The converted signal is provided the input terminal of the non-selected power amplifier 236, which produces a minimal output signal. The output of the power amplifiers 224 and 236 is summed at an adder 242 and provided to an antenna 244 for transmission.

The base station 202 also includes cooling devices 246 and power devices 248. The power devices 248 can include AC-DC conversion and battery backup devices that protect the base station 202 from power loss failures. The power devices 248 and cooling devices 246 can be substantially reduced in size and cost compared to conventional devices since the multiple polar amplifier system 211 of the present invention operates with substantially more efficiency than conventional amplifier systems. Although the base station 202 is illustrated as having a single transmitter 210, the base station 202 can have a plurality of transmitters communicating to different respective groups of MCUs over similar communication signal standards or different communication signal standards. Additionally, the MCUs 212 and 214 can also include transmitters with multiple polar amplifier systems similar to the described amplifier system 211.

Figure 7:
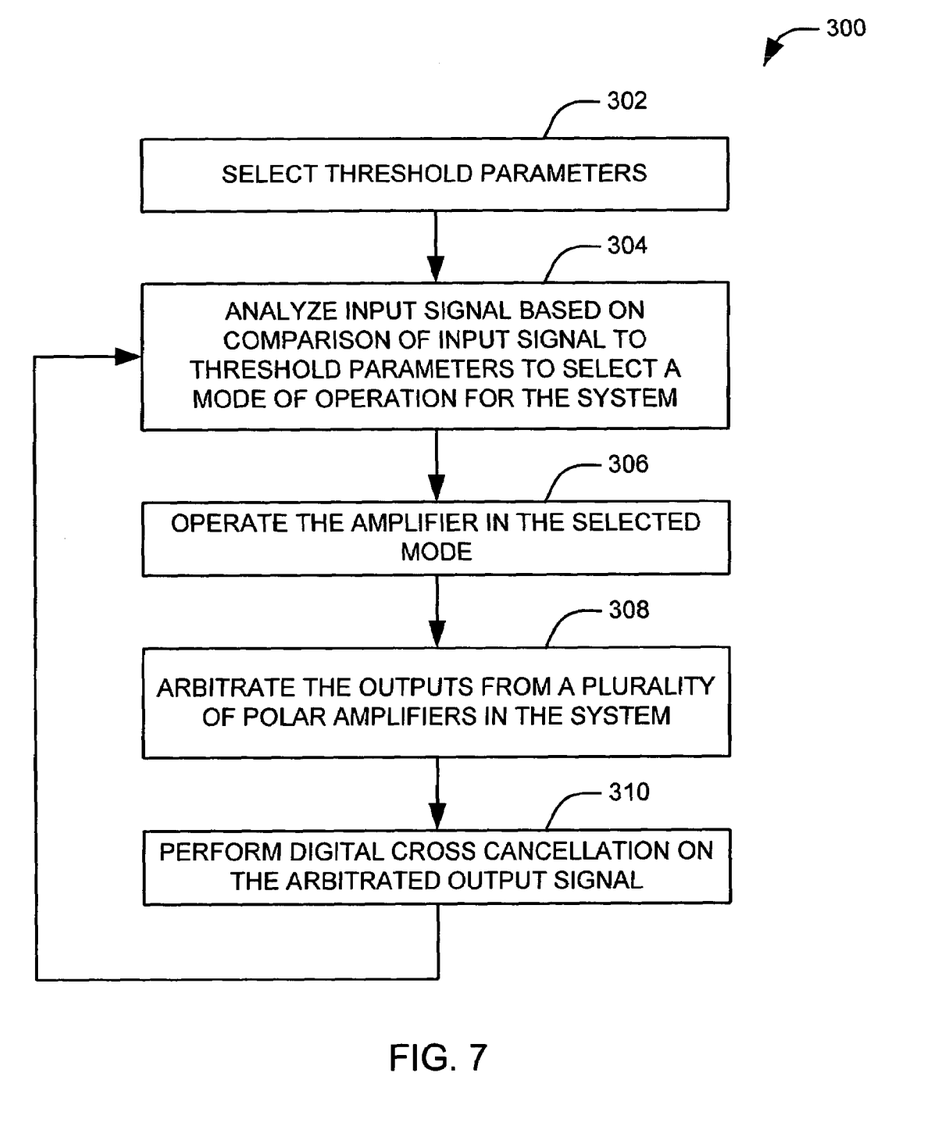
FIG. 7 illustrates a methodology for amplifying an input signal in accordance with an aspect of the present invention.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 7 illustrates a methodology 300 for amplifying an input signal in a multiple polar amplifier system in accordance with an aspect of the present invention. The methodology begins at 302 where one or more threshold parameters are selected. It will be appreciated that the one or more parameters can correspond to properties of a plurality of polar amplifiers comprising the amplifier system. A given threshold parameter can represent, for example, an envelope amplitude level for which a polar amplifier within the amplifier system operates normally for input signals having envelope amplitude levels above the threshold, but begins to distort and/or cut-off for input signals having envelope amplitude levels below the threshold. At 304, the input signal is analyzed based on a comparison of the input signal to the threshold parameters to select a mode of operation for the system. For example, the input signal can be buffered and analyzed prior to amplification. Alternatively, the input signal can be analyzed as portions of the input signal are being amplified. The input signal can be in a number of different single carrier or multi-carrier amplitude and/or phase modulated signal formats (e.g., WCDMA, GSM, OFDM).

At 306, the system is operated in the selected mode to efficiently amplify the input signal. At least two modes are associated with respective polar amplifiers, such that operating in one of these modes includes operating its associated polar amplifier to amplify the input signal. A third mode of operation can include allowing the input signal to remain unamplified, or providing an amplified signal via a digital cross-cancellation technique. If a mode utilizing a polar amplifier assembly is selected, an amplitude modulated component of the input signal is transmitted to a supply terminal of the selected power amplifier, and a constant envelope phase modulated component is transmitted to an input of the power amplifier. A given power amplifier can be a non-linear class (e.g., Class C, D, E and F type amplifiers) or a linear class amplifier (e.g., Class A, AB and B type amplifiers). The power amplifier input signal and the power amplifier supply signal can be transmitted in digital format, and converted into the analog domain via respective DACs (e.g., delta-sigma modulated DACs). The amplifier supply signal is then amplified, for example, employing a Class-S or Class-G amplifier/modular, prior to being provided to the supply terminal of the power amplifier.

Non-selected polar amplifiers are left idle. A substantially constant voltage supply signal is transmitted to the supply terminal of each idle power amplifier, and one of a phase modulated, component, the composite input signal, no signal and a constant signal can be transmitted to the inputs of the non-selected power amplifiers to produce minimal output signals with minimal power consumption. In an exemplary embodiment, the system can also operate in a restoration mode, not associated with a specific polar amplifier, that utilizes a digital cross-cancellation technique. The digital cross cancellation technique provides portions of the desired signal at amplitudes where the polar amplifiers cannot operative effectively. During the restoration mode, all of the polar amplifiers remain idle.

At 308, the outputs of the various amplifiers are arbitrated to provide an overall output for the signal. This can include switching between the amplifier paths to pass only the output of the selected amplifier path, or combining the amplifier outputs to form a final signal. In an exemplary embodiment, the outputs of the amplification assemblies are summed at an adder, with the minimal output of any idle amplifiers having a negligible effect on the total signal. If neither amplifier is active, the signal can be provided by adding the result of the digital cross-cancellation to the negligible outputs of the idle power amplifiers.

At 310, digital cross-cancellation is performed on the arbitrated amplifier output. A digital cross-cancellation technique provides a digital reference to a separate DAC generating a "clean" version of the wanted signal. The clean version of the wanted signal is inverted and combined with an attenuated version of the actual output signal from the power amplifier to determine the unwanted portion of the output signal. The unwanted portion of the input signal is then inverted, amplified, and combined with a delayed version of the output of the power amplifier to cancel the unwanted portion from the output signal. The digital cross cancellation technique mitigates distortion and OOB emissions. The amplified and corrected signal can then be transmitted to a receiver. The methodology 300 then returns to 304 to analyze a new portion of the input signal and select an appropriate amplifier.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplifier system that amplifies an input signal comprising:
   a first polar amplifier assembly operative to amplify the input signal to produce an amplified output signal for the system when the system is in a first mode;
   a second polar amplifier assembly operative to amplify the input signal to produce the amplified output signal for the system when the system is in a second mode;
   a correction path that is operative to provide at least a substantial portion of the amplified output signal when the system is in a third mode; and
   a mode selector that selects a mode of operation from at least the first, second, and third modes for the amplifier system according to at least one characteristic of the input signal relative to at least one threshold parameter.

2. The system of claim 1, the at least one characteristic of the input signal comprising the amplitude of the input signal envelope.

3. The system of claim 1, the first polar amplifier assembly being fabricated via a first fabrication technology having a first set of associated properties, and the second polar amplifier assembly being fabricated via a second fabrication technology having a second set of associated properties.

4. The system of claim 3, the first fabrication technology comprising one of Gallium Nitride (GaN) and Laterally Diffused Metal Oxide Semiconductors (LDMOS) and the second fabrication technology comprising one of Gallium Arsenide (GaAs), Indium Phosphide (InP), and Complementary Metal Oxide Semiconductors (CMOS).

5. The system of claim 1, the amplifier system comprising N polar amplifier assemblies, where N is an integer greater than two, each of the N polar amplifier assemblies having associated modes that can be selected by the mode selector according to at least one characteristic of the input signal.

6. The system of claim 1, the input signal being a phase and/or amplitude modulated signal and the at least one threshold parameters representing respective envelope amplitude levels associated with the input signal, such that the first mode is selected when the input signal envelope amplitude level is greater than a first threshold parameter, the second mode is selected when the input signal envelope amplitude level falls between the first threshold parameter and a second threshold parameter, and the third mode is selected when the input signal envelope amplitude level falls below the second threshold parameter.

7. The system of claim 1, the mode selector providing a digital representation of a reference signal corresponding to a desired amplified output signal to a first summer through a digital-to-analog converter (DAC), the first summer receiving a portion of an output of the amplifier system through a coupler and providing a cancellation signal to a cancellation amplifier, the amplified cancellation signal being inverted and combined with a delayed version of the amplified output signal through a second summer.

8. The system of claim 7, the cancellation amplifier being a linear amplifier.

9. The system of claim 1, the first and second polar amplifier assemblies comprising respective first and second power amplifiers, each of the first and second power amplifiers having an associated input terminal and an associated supply terminal.

10. The system of claim 1, the first and second power amplifiers being non-linear class type amplifiers.

11. The system of claim 9, the mode selector providing a phase modulated digital input signal to the input terminal of the first power amplifier through a first DAC, and a amplitude modulated digital supply signal to the supply terminal of the first power amplifier through a second DAC and a first modulation amplifier when the system is operating in the first mode, and providing the phase modulated digital input signal to the input terminal of the second power amplifier through a third DAC, and the amplitude modulated digital supply signal to the supply terminal of the second power amplifier through a fourth DAC and a second modulation amplifier when the system is operating in the second mode.

12. The system of claim 1, at least one of the first, second, third, and fourth DACs being delta-sigma DACs, such that the at least one of the phase modulated digital input signal and the amplitude modulated digital supply signal are converted into the analog domain directly at a desired radio transmission frequency.

13. The system of claim 1, the first modulation amplifier and the second modulation amplifier each being one of a Class-S type and a Class-G type modulator.

14. The system of claim 1, the mode selector providing a reference signal corresponding to a desired output signal of the amplifier system to a digital cross-cancellation assembly, the reference signal being combined with a portion of the amplified output signal to determine a cancellation signal, the cancellation signal being amplified, inverted and combined with a delayed version of the amplified output signal to generate a final output signal.

15. The system of claim 14, the digital cross-cancellation assembly being associated with the third mode, the amplified inverted cancellation signal providing at least a substantial portion of the amplified output signal while the third mode of operation is selected, and the amplified inverted cancellation signal mitigating signal distortion and out-of-band (OOB) emissions associated with the amplified output signal while one of the first and second modes of operation is selected.

16. The system of claim 15, the input signal being a phase and/or amplitude modulated signal and the at least one threshold parameters representing respective envelope amplitude levels associated with the input signal, such that the first mode is selected when the input signal envelope amplitude level is greater than a first threshold parameter, the second mode is selected when the input signal envelope amplitude level falls between the first threshold parameter and a second threshold parameter, and the third mode is selected when the input signal envelope amplitude level falls below the second threshold parameter.

17. A transmitter comprising the amplifier system of claim 1.

18. A base station comprising the transmitter of claim 17.

19. An amplifier system comprising:
a plurality of power amplifiers, each operative to amplify an input signal to provide an amplified output signal;
respective input paths coupled to respective input terminals of the plurality of power amplifiers;
respective supply paths coupled to respective supply terminals of the plurality of power amplifiers; and
a mode selector that selects one of the plurality of power amplifiers to operate as a polar amplifier based on a characteristic of the input signal relative to at least one threshold parameter and transmits one of a phase modulated component of the input signal, a constant amplitude signal and no signal to respective input terminals of at least one non-selected power amplifier from the plurality of power amplifiers and a substantially constant amplitude signal to the respective supply terminals of the at least one non-selected power amplifier.

20. The system of claim 19, further comprising an output arbitrator that produces a unified output signal from respective outputs of the plurality of power amplifiers.

21. The system of claim 20, the output arbitrator comprising at least one summer that sums the outputs of the plurality of power amplifiers.

22. The system of claim 19, the mode selector transmitting a phase modulated signal component of the input signal to the input terminal of the selected power amplifier and an amplitude modulated signal component of the input signal to the supply terminal of the selected power amplifier.

23. The system of claim 19, each of the plurality of power amplifiers being fabricated via an associated fabrication technique, the at least one threshold parameter being selected according to properties of the associated fabrication techniques.

24. A method of amplifying an input signal, the method comprising:
selecting between a first mode of operation, associated with a first polar amplifier, and a second mode of operation associated with a second polar amplifier, wherein the second mode of operation is selected when the amplitude of the input signal falls within an amplitude range that includes a distortion range associated with the second polar amplifier, the distortion range including a zero crossing point of the signal;
amplifying the input signal via the first polar amplifier in the first mode of operation and via the second polar amplifier in the second mode of operation while continuously switching between the plurality of modes of operation to provide an amplified output signal.

25. The method of claim 24, further comprising performing a signal correction on the amplified output signal, the signal correction comprising generating a separate reference signal corresponding to a desired output signal, the reference signal being combined with a portion of the amplified output signal to determine a cancellation signal, the cancellation signal being amplified, inverted and combined with a delayed version of the amplified output signal to generate a final output signal.

26. The method of claim 25, the signal correction mitigating distortion and out-of-band (OOB) emissions during the first and second modes of operation and providing at least a substantial portion of the amplified output signal when the amplitude of the input signal falls within the distortion range of the second amplifier.

27. An amplifier system comprising:
a plurality of power amplifiers, each operative to amplify an input signal to provide an amplified output signal;
respective input paths coupled to respective input terminals of the plurality of power amplifiers;
respective supply paths coupled to respective supply terminals of the plurality of power amplifiers;
a mode selector that selects one of the plurality of power amplifiers to operate as
a polar amplifier based on a characteristic of the input signal relative to at least one threshold parameter;
an output arbitrator that produces a unified output signal from respective outputs of the plurality of power amplifiers; and
a correction path that mitigates signal distortion and out-of-band (OOB) emissions associated with the unified output signal.

28. The system of claim 27, the correction path comprising:
a digital-to-analog converter (DAC) having an input coupled to the mode selector;
a first summer having a first input coupled to an output of the DAC and a second input coupled to an output of the output arbitrator through a coupler;
a cancellation amplifier having an input coupled to an output of the first summer and an output coupled to a second summer, wherein the DAC receives a digital representation of a reference signal corresponding to a desired amplified output signal that is converted into an analog reference signal and combined with a portion of the unified output signal through the first summer to provide a cancellation signal that is amplified by the cancellation amplifier, and the amplified cancellation signal is inverted and combined with a delayed version of the unified output signal through the second summer.

* * * * *